United States Patent
Yang et al.

(10) Patent No.: US 6,862,219 B2
(45) Date of Patent: Mar. 1, 2005

(54) WEAK PROGRAMMING METHOD OF NON-VOLATILE MEMORY

(75) Inventors: Shih-Hsien Yang, Hsinchu (TW); Chien-Min Wu, Hsinchu (TW); James Juen Hsu, Saratoga, CA (US); Chi-Moon Huang, Hsinchu (TW)

(73) Assignee: Winbond Electronics Corp., Hsinchu (TW)

( * ) Notice: Subject to any disclaimer, the term of this patent is extended or adjusted under 35 U.S.C. 154(b) by 0 days.

(21) Appl. No.: 10/249,140

(22) Filed: Mar. 19, 2003

(65) Prior Publication Data

US 2004/0184320 A1 Sep. 23, 2004

(51) Int. Cl.$^7$ .............................................. G11C 16/04
(52) U.S. Cl. ............................ 365/185.28; 365/185.33
(58) Field of Search ..................... 365/185.28, 185.33, 365/185.26, 185.29

(56) References Cited

U.S. PATENT DOCUMENTS 5,295,107 A * 3/1994 Okazawa et al. ........ 365/185.3
2003/0206451 A1 * 11/2003 Tanaka et al. ............. 365/200

* cited by examiner

*Primary Examiner*—Thong Q. Le
(74) *Attorney, Agent, or Firm*—Jiang Chyun IP Office

(57) ABSTRACT

A weak programming method of a non-volatile memory. A first voltage is applied to a substrate during a first duration, while a control-gate voltage, such as zero volt, is applied to the gate, such that the leakage of the bit line is reduced and electron-hole pairs are generated. In the second duration, a second voltage is applied to the substrate, and a third voltage is applied to the gate to enhance the capability of injecting electrons into the floating gate of the non-volatile memory. Therefore, the distribution of the threshold voltage is more concentrated. The second voltage has a polarity the same as that of the first voltage, while the polarity of the third voltage is opposite to that of the second voltage.

19 Claims, 4 Drawing Sheets

WEAK PROGRAMMING METHOD OF NON-VOLATILE MEMORY

BACKGROUND OF INVENTION

Field of Invention

The present invention relates in general to a weak programming method, and more particularly, to a weak programming method of a non-volatile memory.

Flash memory is an electrical erasable and programmable read only memory (EEPROM), which has the advantages of writable, erasable, and data retention after power interrupt. Therefore, the flash memory has been broadly applied in personal computer and electronic equipment. In addition, the flash memory is a kind of a non-volatile memory and has the properties of small volume, fast access speed and low power consumption. Further, the flash memory is characterized in erasing data with a block-by-block method. During erase operation by Fowler-Nordheim (FN) tunneling, the broad distribution of the erase threshold voltage often causes the bit line of the flash memory generating more leakage current.

In the conventional flash memory, the substrate is isolated from the floating gate via a tunneling oxide layer, while a control gate is formed on the floating gate with an inter-gate dielectric layer isolating the control and floating gates. Such flash memory is referred as a stacked-gate flash memory with the floating and control gates made of doped polysilicon and source and drain regions formed in the substrate at two sides of the stacked gate.

During the write operation, the source region of the flash memory is grounded, and appropriate voltages are applied to the control gate and the drain region to inject electrons into the floating gate. During the read operation, the above appropriate voltage is applied to the control gate to switch on/off the channel under the floating gate, such that the data value 0 or 1 is read. In addition, during the erase operation, the relative voltages of the substrate, the drain (source) region or the control gate is raised, so that the electrons are tunneling through the tunneling oxide layer to the substrate. This is referred as the substrate erase or drain (source) side erase. Alternatively, the electrons may be expelled to the control gate through the inter-gate dielectric layer.

During the write operation, the flash memory is normally programmed by channel hot electrons injection (CHEI) to write data into the flash memory. While erasing the data of the flash memory, the Fowler-Nordheim tunneling is typically applied to pull the electrons from the floating gate through the tunneling oxide layer to the channel region.

While performing erase operation by Fowler-Nordheim tunneling, the number of electrons pulled from the floating gate is difficult to control. When an excessive amount of electrons is pulled from the floating gate, the polarity of the floating gate becomes positive to cause over-erase. As a result, the threshold voltage distribution of the flash memory is broadened, and the leakage current of the bit line is generated. When the over-erase effect is serious, the channel region is conducted without voltage application to the control gate to cause data error. Therefore, soft program and over-erase verifying method have been developed to resolve the over-erase problem for the flash memory. However, such methods results in problems of longer erase time and larger area of hardware circuit.

SUMMARY OF INVENTION

The present invention provides a weak programming method of a non-volatile memory for mending over-erase effect, reducing erase time and enhancing reliability thereof.

The weak programming method provided by the present invention is applied to a non-volatile memory which comprises at least a control gate and a substrate. In a first duration, a first voltage is applied to the substrate, while a control-gate voltage, such as zero volt, is applied to the control gate. In a second duration, a second voltage is applied to the substrate and a third voltage is applied to the control gate. The polarities of the first and second voltages are the same, while the polarity of the third voltage is opposite to that of the first voltage.

In the first duration, the first voltage applied to the substrate is negative to reduce the leakage current of the bit line of the non-volatile memory, so as to prevent the leakage current from producing error data. Further in the first duration, electron-hole pairs are generated by the junction electric field at the drain region of the non-volatile memory.

In the second duration, the second voltage is applied to the substrate and the third voltage is applied to the control gate, allowing the vertical electric field between the control gate and the substrate to increase, so as to increase the number of electrons injecting into the floating gate.

In the present invention, should over-erase should occur to the flash memory, a negative voltage is applied to the substrate (P-well) and zero volt is applied to the control gate. The negative applied to the substrate (P-well) is then maintained, and a positive voltage is applied to the control gate. The following steps generate electron-hole pairs by the junction electric field at the drain region of the flash memory, such that the vertical electric field of the flash memory is increased, and the electrons attain enough energy to tunnel through the tunneling oxide to reach the floating gate.

BRIEF DESCRIPTION OF DRAWINGS

The accompanied drawings are included to provide a further understanding of the present invention, and are incorporated in and constitute a part of this specification. The drawings illustrate embodiments of the present invention and, together with the description, serve to explain the principles of the present invention. In the drawings.

DETAILED DESCRIPTION

Figure 1:
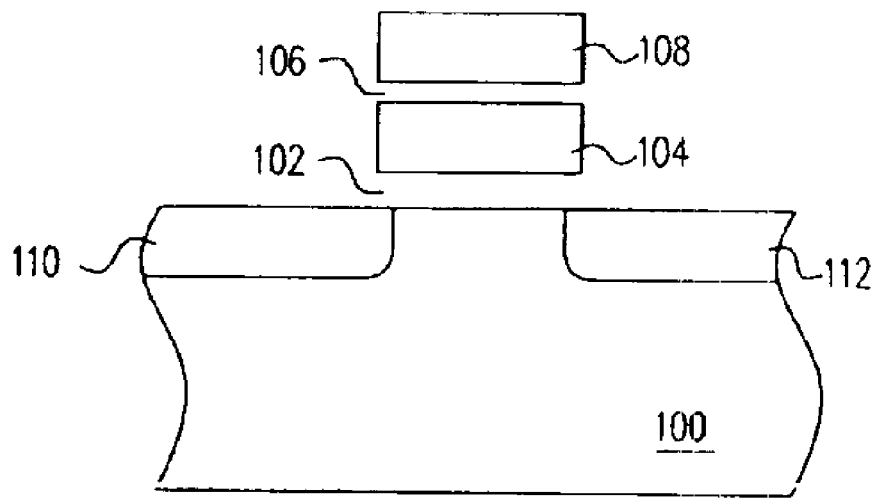
FIG. 1 is a cross-durational view of a flash memory.

FIG. 1 shows a cross-durational view of a non-volatile flash memory. In FIG. 1, the flash memory comprises a substrate 100, a tunneling oxide layer 102, a floating gate 104, an inter-gate dielectric layer 106, a control gate 108, a source region 110 and a drain region 112.

The substrate 100 includes a silicon substrate, for example. The substrate 100 comprises a P-well therein. The control gate 108 is formed on the substrate 100. The material for forming the floating gate 104 and the control gate 108 includes doped polysilicon, for example. The inter-gate dielectric layer 106 is formed between the control gate 108 and the floating gate 104. The material for forming the inter-gate dielectric layer 106 includes silicon oxide/silicon nitride/silicon oxide, for example. It is appreciated that the material for forming the inter-gate dielectric layer 106 may further includes material such as silicon oxide, silicon oxide/ silicon nitride. The tunneling oxide layer 108 is formed between the floating gate 104 and the substrate 100. The material for forming the tunneling oxide layer 108 includes silicon oxide, for example. The source region 110 and the drain region 112 are formed in the substrate 100 at two sides of the floating gate 104.

In one embodiment, the flash memory may include n-channel or p-channel flash memory. For the n-channel flash memory, the mode for writing and erasing data includes:

(1) using the channel hot electron injection mode to inject the electrons from the drain region 112 to the floating gate 104 (for writing data), and using Fowler-Nordheim tunneling to pull electrons from the floating gate to the source region 110 (for erasing data);

(2) using Fowler-Norheim tunneling to injection electrons from the channel region to the floating gate 104 (for writing data), and using Fowler-Nordheim tunneling mode to pull electrons from the floating gate to the drain region (for erasing data);

(3) using Fowler-Nordheim tunneling mode to inject electrons from the channel region to the floating gate 104 (for writing data), and to pull electrons from the floating gate to the channel region using Fowler-Nordheim tunneling mode (for erasing data);

(4) using channel hot electron injection mode to inject electrons from the drain region 112 to the floating gate 104 (for writing data), and pulling electrons from the floating gate to the channel region using Fowler-Nordheim tunneling mode (for erasing data).

For the p-channel flash memory, the modes for writing data and erasing data includes using band-to-band tunneling induced hot electron injection (BBHE) to injection electrons from the drain region 112 to the floating gate 104 (for writing data), and to pull electrons from the channel region (for erasing data).

Figure 2A:
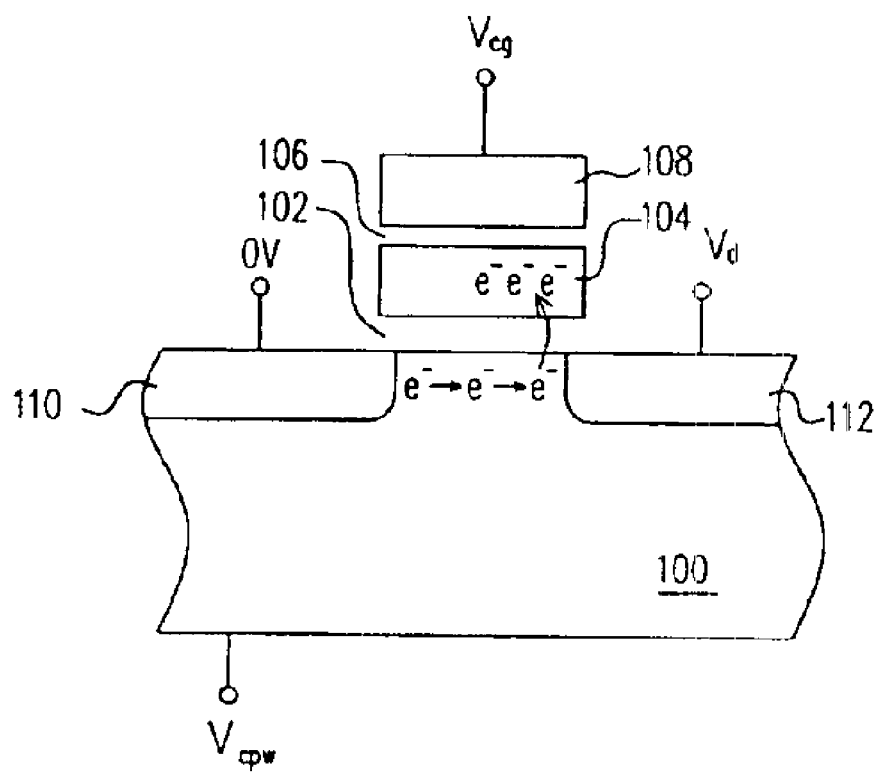
FIG. 2A shows the operation of a weak programming method of a flash memory according to the present invention.
Figure 2B:
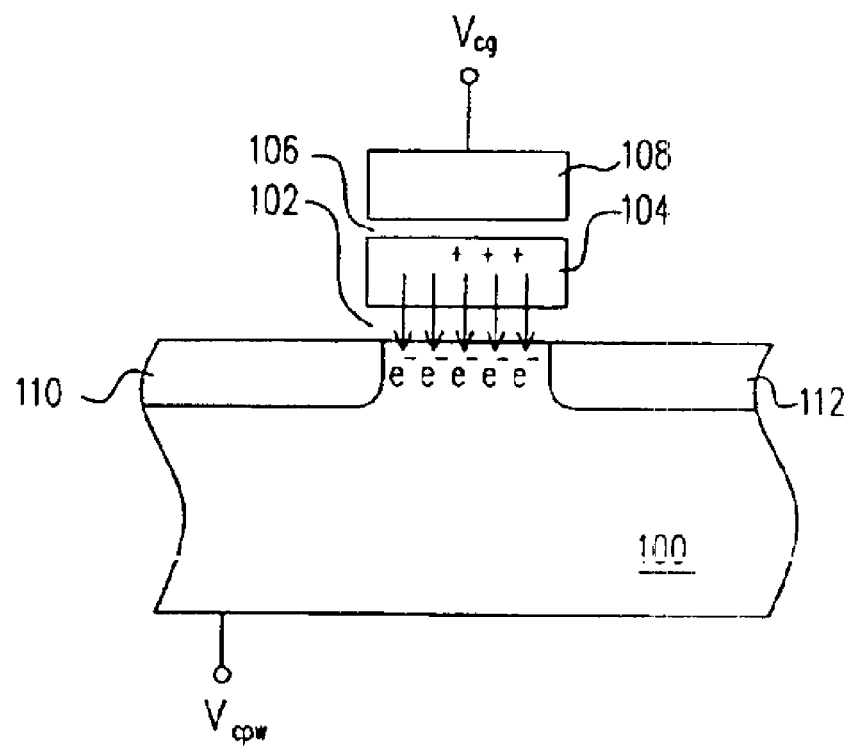
FIG. 2B shows the operation of a weak programming method of a flash memory according to the present invention.
Figure 2C:
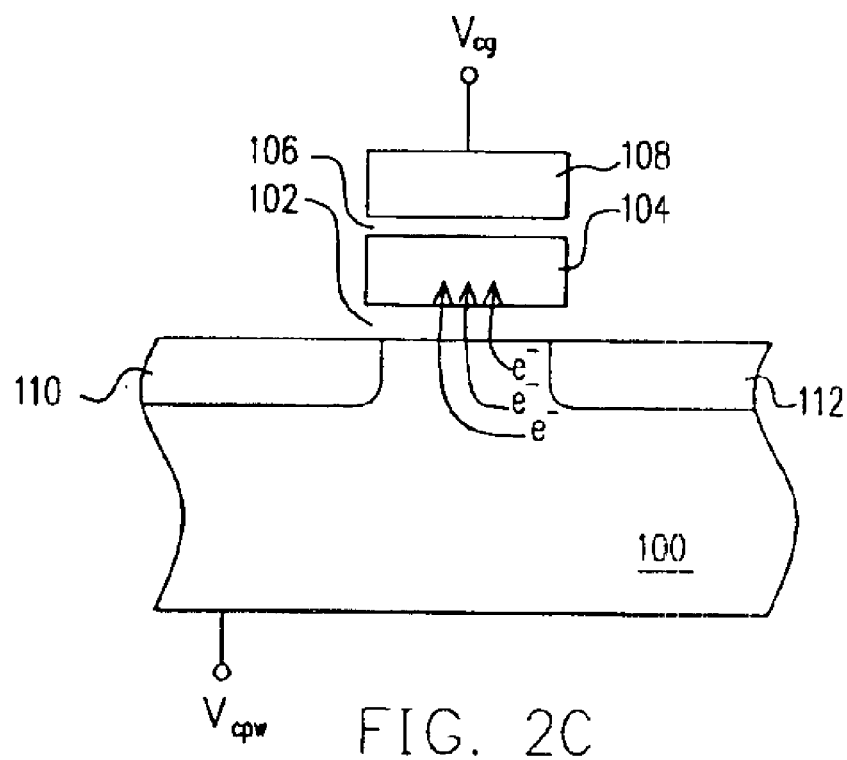
FIG. 2C shows the operation of a weak programming method of a flash memory according to the present invention.

Referring to FIGS. 2A, 2B and 2C, operation of weak program of the flash memory provided by the present invention is shown. The operation includes programming the flash memory and method of mending over-erase effect of the flash memory using weak programming method.

While programming the flash memory, a voltage Vcg such as 9V to 12 V is applied to the control gate 108, a voltage Vd such as 5V to 7V is applied to the drain region 112, while the voltage applied to the source region is 0V, allowing the voltage of the substrate 100 (P-well) to be zero. Under such condition, a large channel current (about 0.25 mA/memory cell to about 1 mA/memory cell) is generated. The electrons moving from the source region 110 to the drain region 112 are accelerated by the high channel electric field to produce hot electrons, which have sufficient kinetic energy to over the energy barrier of the tunneling oxide layer 102. By the application of the high positive voltage on the control gate 108, the hot electrons are injected from the drain region 112 to the floating gate 104 as shown in FIG. 2A. After programming, net negative charges remain in the floating gate 104, so that the threshold voltage $V_T$ of the flash memory is increased. These negative charges can be retained in the floating gate 104 for a long time (for example, 10 years under room temperature) without intentional erase operation.

In FIG. 2B, Fowler-Nordheim tunneling is operated. A control-gate voltage, such as zero volt, is applied to the control gate 108. A positive voltage, for example, 20V, is applied to the substrate 100. The source region 110 and the drain region 112 under a floating condition, electrons are pulled from the floating gate 104 to the channel region. As one cannot control the number of the electrons pulled from the floating gate 104, over-erase is likely to occur to result in the floating gate 104 carrying positive charges.

In FIG. 2C, to mend the over-erase effect, a negative voltage such as 2V is applied to the substrate 100, while no voltage is applied to the control gate 108. The source region 110 is grounded, the voltage applied to the drain region is about 4V to about 5V. Meanwhile, electron-hole pairs are generated at the junction between the drain region 112, and the leakage current of the bit line is reduced. A voltage such as 0.5V to 1.5V is applied to the control gate 108, and the voltage applied to the substrate 100 is maintained at about 2V. The source region 110 is connected to the ground, and the drain region 112 is connected to 4V to 5V. The positive voltage applied to the non-volatile memory increases the vertical electric field, such that electrons generated at the junction of drain region 112 is increased to gain enough energy for tunneling through the tunneling oxide layer 102 and entering the floating gate 104.

In one embodiment of the present invention, the flash memory includes an n-channel flash memory.

Figure 3:
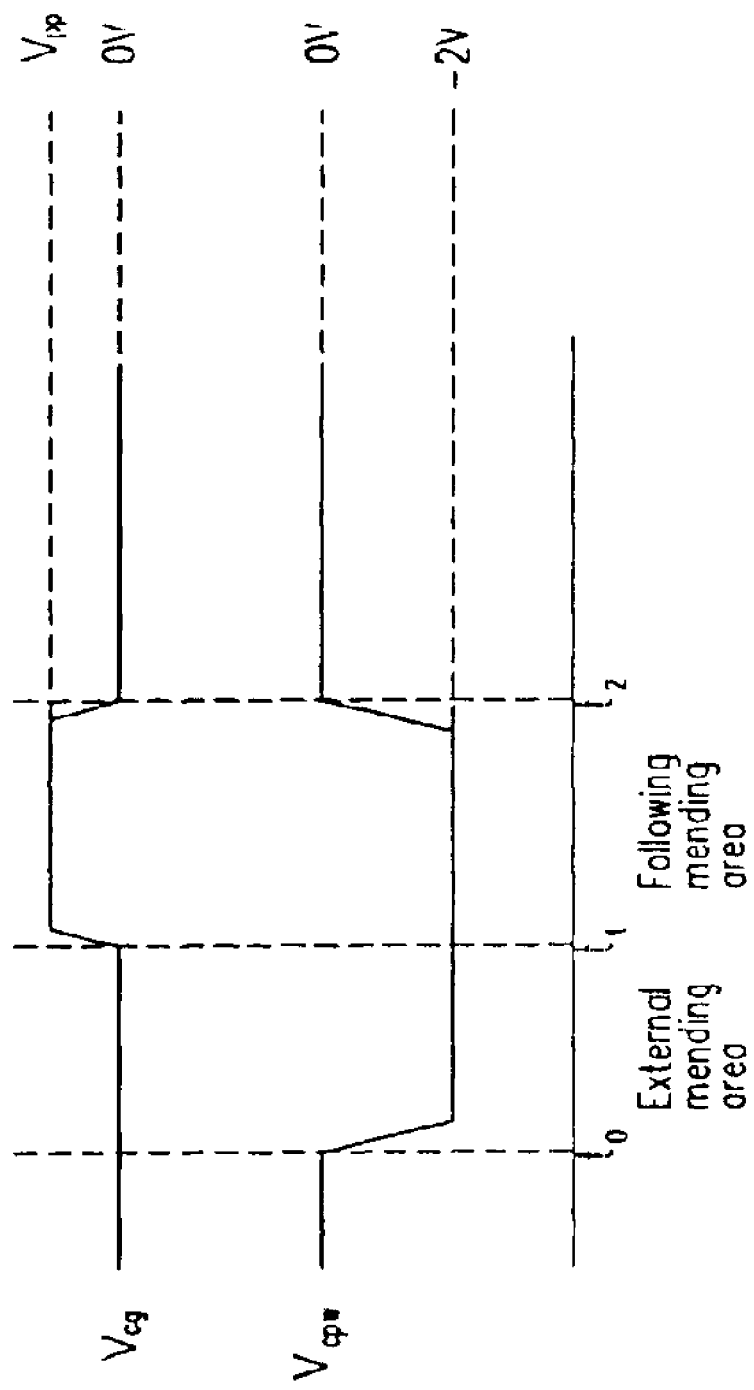
FIG. 3 shows the timing diagram of weak programming operation of the flash memory according to the present invention.
Figure 4A:
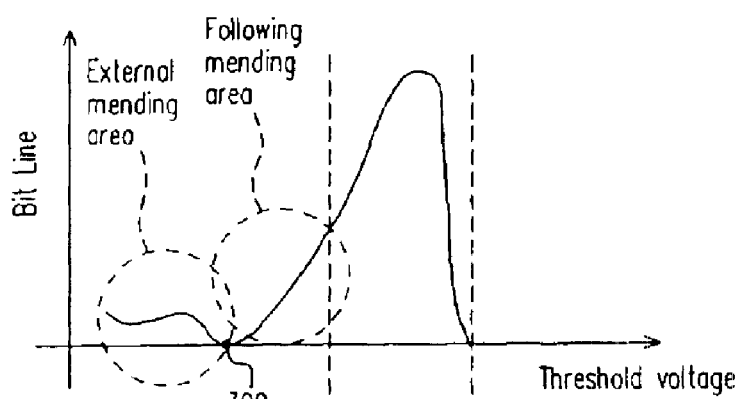
FIGS. 4A to 4C show the threshold voltage distribution of the flash memory according to the present invention.
Figure 4B:
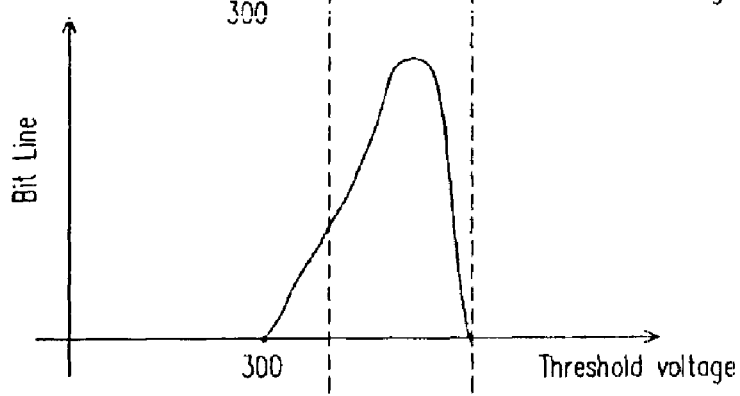
Figure 4C:
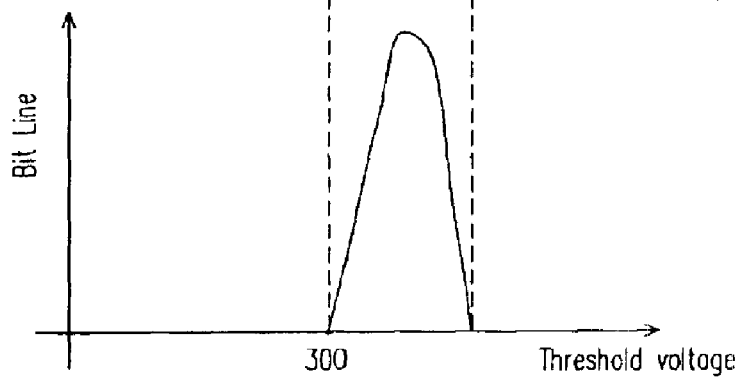

Referring to FIGS. 3, 4A and 4C, the timing diagram of the operation voltage applied to the weak program, and the threshold voltage distribution of the flash memory are shown. The diagram illustrates the threshold voltage distribution for erase operation and after weak program. The range between time $t_0$ to $t_1$ includes external mending area, and the range between time $t_1$ to $t_2$ is the following mending area.

FIG. 4A shows the threshold voltage distribution of the flash memory while over-erase occurs. The distribution includes the external mending area and the following mending area. In the external mending area between $t_0$ to $t_1$ as shown in FIG. 3, a negative voltage −2V is applied to the substrate, while zero volt is applied to the control gate. Meanwhile, the source region is connected to the ground, and the drain region is supplied with 4V to 5V. Thereby, the leakage current of the bit line is reduced, the merging point 300 of the threshold voltage is shifted towards the right (as shown in FIG. 4B). In the following mending area between $t_1$ to $t_2$ as shown in FIG. 3, a voltage of about 0.5V to about 1.5V is applied to the control gate, the substrate is supplied with −2V, the source region is grounded, and the drain region is supplied with 4V to 5V. Thereby, the number of electrons injected to the floating gate is increased, and the merging point 300 shifts further toward the right (as shown in FIG. 4C). Therefore, as shown in FIGS. 4A, 4B and 4C, the distribution of threshold voltage is concentrated after weak program.

According to the above, the weak program of the flash memory has the following advantages.

(1) By the weak programming method of the flash memory, a narrower threshold voltage distribution for the erase operation is obtained by controlling the voltage applied to the control gate.

(2) In the weak programming method, the substrate is supplied with a negative voltage to suppress hot holes injected into the SiO$_2$/Si interface, such that the reliability of the flash memory is enhanced.

(3) By the weak programming method, the over-erase is mended and the threshold voltage distribution is more concentrated to reduce power consumption.

While the present invention has been particularly shown and described with reference to preferred embodiments thereof, it will be understood by those of ordinary skill in the art that various changes in form and details may be made therein without departing from the spirit and scope of the present invention as defined by the appended claims.

What is claimed is:

1. A weak programming method for a non-volatile flash memory that comprises a control gate and a substrate, the method comprising:

applying a first voltage having a first polarity to the substrate and applying a control-gate voltage to the control gate in a first duration; and applying a second voltage having the first polarity to the substrate and a third voltage having a second polarity to the control gate in a second duration; wherein the first polarity is opposite to the second polarity.

2. The method as claimed in claim 1, wherein the second duration is subsequent to the first duration.

3. The method as claimed in claim 1, wherein the flash memory includes an n-channel flash memory.

4. The method as claimed in claim 1, wherein when the substrate is a P-type substrate, the first voltage applied to the substrate is a negative voltage to reduce leakage current of a bit line of the flash memory.

5. The method as claimed in claim 4, wherein the second voltage is about −2V.

6. The method as claimed in claim 1, wherein the second voltage is about −2V.

7. The method as claimed in claim 6, wherein the third voltage is about 0.5V to about 1.5V.

8. The method as claimed in claim 1, wherein the control-gate voltage applied to the control gate is zero volt.

9. The method as claimed in claim 1, wherein the first polarity is a negative polarity.

10. A method of mending over-erase of a flash memory that comprises a control gate and a substrate, the method comprising:

erasing the flash memory;

applying a first voltage having a first polarity to the substrate and applying a control-gate voltage to the control gate an a first duration; and applying a second voltage having the first polarity to the substrate and a third voltage having a second polarity to the control gate in a second duration; wherein the first polarity is opposite to the second polarity.

11. The method as claimed in claim 10, wherein the second duration is subsequent to the first duration.

12. The method as claimed in claim 10, wherein the step of erasing the flash memory includes using Fowler-Nordheim tunneling to pull a plurality of electrons from a floating gate of the flash memory.

13. The method as claimed in claim 10, wherein the flash memory includes an n-channel flash memory.

14. The method as claimed in claim 10, wherein when the substrate includes a P-type substrate, the first voltage includes a negative voltage applied to the substrate in the first duration to reduce leakage current of a bit line of the flash memory.

15. The method as claimed in claim 14, wherein the first voltage is about −2V.

16. The method as claimed in claim 10, wherein the second voltage is about −2V.

17. The method as claimed in claim 10, wherein the third voltage is about 0.5V to about 1.5V.

18. The method as claimed in claim 10, wherein the control-gate voltage applied to the control gate is zero volt.

19. The method as claimed in claim 10, wherein the first polarity is a negative polarity.

\* \* \* \* \*